United States Patent
Hsu et al.

(10) Patent No.: US 8,003,461 B1
(45) Date of Patent: Aug. 23, 2011

(54) METHOD OF FABRICATING EFUSE STRUCTURE, RESISTOR STURCTURE AND TRANSISTOR STURCTURE

(75) Inventors: Che-Hua Hsu, Hsinchu County (TW); Zhi-Cheng Lee, Tainan (TW); Cheng-Guo Chen, Changhua County (TW); Shao-Hua Hsu, Taoyuan County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 53 days.

(21) Appl. No.: 12/700,707

(22) Filed: Feb. 4, 2010

(51) Int. Cl.
*H01L 21/8242* (2006.01)

(52) U.S. Cl. .......... 438/239; 257/E21.396; 257/E21.569

(58) Field of Classification Search ............ 438/48, 438/692, 783, 780, 789, 694, 239, 197; 257/E23.147, E21.396, E21.551, E21.569
See application file for complete search history.

(56) References Cited

U.S. PATENT DOCUMENTS

| | | | | |
|---|---|---|---|---|
| 6,406,956 | B1 * | 6/2002 | Tsai et al. | 438/201 |
| 2006/0157819 | A1 * | 7/2006 | Wu | 257/529 |
| 2009/0236669 | A1 * | 9/2009 | Chen et al. | 257/380 |
| 2010/0068876 | A1 * | 3/2010 | Lin et al. | 438/591 |
| 2010/0140719 | A1 * | 6/2010 | Yamasaki et al. | 257/379 |
| 2010/0320509 | A1 * | 12/2010 | Knorr et al. | 257/288 |

* cited by examiner

*Primary Examiner* — Walter L Lindsay, Jr.
(74) *Attorney, Agent, or Firm* — Winston Hsu; Scott Margo

(57) ABSTRACT

A method of fabricating an efuse structure, a resistor structure and a transistor structure. First, a work function metal layer, a polysilicon layer and a first hard mask layer are formed to cover a transistor region, a resistor region and an e-fuse region on a substrate. Then, the work function metal layer on the resistor region and the efuse region is removed by using a first photomask. Later, a gate, a resistor, an efuse are formed in the transistor region, the resistor region and the efuse region respectively. After that, a dielectric layer aligning with the top surface of the gate is formed. Later, the polysilicon layer in the gate is removed by taking a second hard mask as a mask to form a recess. Finally, a metal layer fills up the recess.

17 Claims, 5 Drawing Sheets

METHOD OF FABRICATING EFUSE STRUCTURE, RESISTOR STURCTURE AND TRANSISTOR STURCTURE

BACKGROUND OF THE INVENTION

1. Field of the Invention

The present invention relates to a method of making a metal gate transistor structure, a resistor structure and an efuse structure.

2. Description of the Prior Art

In computing, efuse is a technology which allows for the dynamic real-time reprogramming of computer chips. Speaking abstractly, computer logic is generally 'etched' or 'hard-coded' onto a chip and cannot be changed after the chip has finished being manufactured. By utilizing an efuse, or a number of individual efuses, a chip manufacturer can allow for the circuits on a chip to change while it is in operation.

The primary application of this technology is to provide in-chip performance tuning. If certain sub-systems fail, or is taking too long to respond, or are consuming too much power, the chip can instantly change its behavior by blowing an efuse.

To increase the performance of transistors, metal gates are popularly used in the semiconductor field. Metal gates with low resistance replace the traditional polysilicon gates. The metal gates are usually formed by the gate-last process.

Additionally, resistors are elements which are often used for providing regulated voltage and for filtering noise in a circuit. The resistors generally include polysilicon and silicide layers.

In the current semiconductor field, fabricating processes are being improved with the aim of reaching high yields. Integrated manufacturing methods of semiconductor devices are also important to decrease the fabricating steps and thereby increase yield. An integrated method for fabricating a metal gate transistor, a resistor and an efuse is needed.

SUMMARY OF THE INVENTION

In light of the above, the first embodiment of the present invention provides a method of fabricating an efuse structure, a resistor structure and a transistor structure. First, a substrate comprising a transistor region, a resistor region, and an efuse region is provided. Then, a work function layer, a polysilicon layer and a first hard mask covering the transistor region, the resistor region, and the efuse region are formed. Later, the work function layer on the resistor region and the efuse region are removed by utilizing a first photo mask. Next, the work function layer, the polysilicon layer and the first hard mask are patterned to form a gate, a resistor, an efuse in the transistor region, the resistor region, and the efuse region, respectively. Subsequently, the first hard mask in the resistor region and the efuse region is removed respectively by utilizing the first photo mask. Next, a planarized dielectric layer on the substrate is formed, and the polysilicon layer in the gate, the resistor and the efuse is exposed. Later, the polysilicon layer in the gate is removed by utilizing a second hard mask as a mask to form a recess. A metal layer is formed to fill up the recess. Finally, the second hard mask is removed.

The second embodiment of the present invention provides another method of fabricating an efuse structure, a resistor structure and a transistor structure. First, a substrate comprising a transistor region, a resistor region, and an efuse region is provided. Next, a work function layer, a polysilicon layer and a first hard mask is formed covering the transistor region, the resistor region, and the efuse region. Then, the transistor region is covered by a patterned first photoresist layer formed by a first photo mask. Later, the work function layer on the resistor region and the efuse region are removed by taking the patterned first photoresist layer as a mask. After that, a gate, a resistor, an efuse are formed in the transistor region, the resistor region, and the efuse region, respectively. Subsequently, a planarized dielectric layer on the substrate is formed, and the polysilicon layer in the gate, the resistor and the efuse is exposed. A patterned second photoresist layer is formed by the first photomask to cover the transistor region and the efuse region, wherein the patterned first photoresist layer and the patterned second photoresist layer are different types. Later, the polysilicon layer in the gate is removed to form a recess. Finally, a metal layer is formed to fill up the recess.

The feature of the present invention is that a single photo mask is used repeatedly to perform a patterning process. Therefore, the cost of making the photo mask can be reduced. Moreover, a hard mask is used to replace a photoresist layer to serve as a mask to remove the polysilicon layer in the gate. When using the photoresist layer as a mask, the silicide on the on the resistor and on the efuse will be damaged when the photoresist layer is removed. However, by using the hard mask as a mask, the damage can be prevented.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
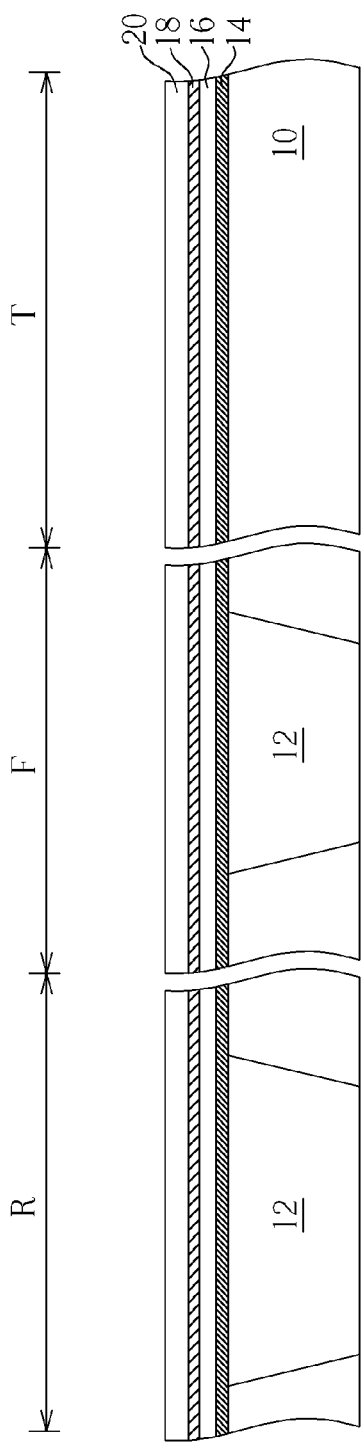
FIG. 1 to FIG. 10 depict a method of fabricating an efuse structure, a resistor structure and a transistor structure schematically according to the preferred embodiment of the present invention.

FIG. 1 to FIG. 10 depict a method of fabricating an efuse structure, a resistor structure and a transistor structure schematically according to the preferred embodiment of the present invention. First, as shown in FIG. 1, a substrate 10 is provided. The substrate 10 has a transistor region T, a resistor region R and an efuse region F. A shallow trench isolation (STI) 12 is disposed in the transistor region T, the resistor region R and the efuse region F, respectively. In the following process, an NMOS, a PMOS or a CMOS can be formed within the transistor region T. In this embodiment, only one type of the transistors is shown in the transistor region T, but not limited to it. Based on different requirements, different transistors can be formed within the transistor region T.

Then, a dielectric layer 14, a high-K material layer 16 and a cap layer 18 are formed on the transistor region T, the resistor region R and the efuse region F from bottom to top. The cap layer 18 is primarily for compensating the work function value of the work function layer, and to make the NMOS and the PMOS possess different work function values. Therefore, the cap layer 18 in the transistor region T can be removed optionally. For example, if an NMOS and a PMOS will be formed in the transistor region T, the cap layer 18 on the region which will have an NMOS on it is removed. Then, a work function layer 20 such as titanium nitride can be formed on the cap layer 18 on the transistor region T, the resistor region R and the efuse region F. The work function layer 20 contacts the high-K material layer 16 in the transistor region T where the cap layer 18 is removed.

Figure 2:
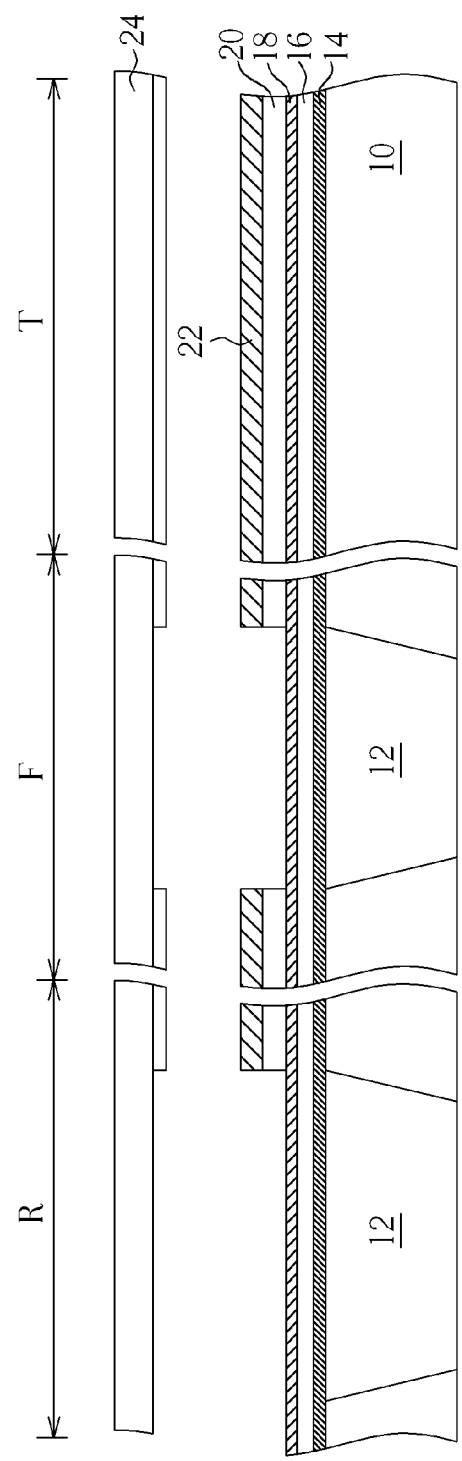

As shown in FIG. 2, a photoresist layer 22 is formed to cover the transistor region T, the resistor region R and the efuse region F. The photoresist layer 22 can be a positive type photoresist. Next, a photo mask 24 is used to pattern the photoresist layer 22, and the resistor region R and the efuse region F are therefore exposed. Then, the work function layer 20 within the resistor region R and the efuse region F is removed to expose the cap layer 18.

Figure 3:
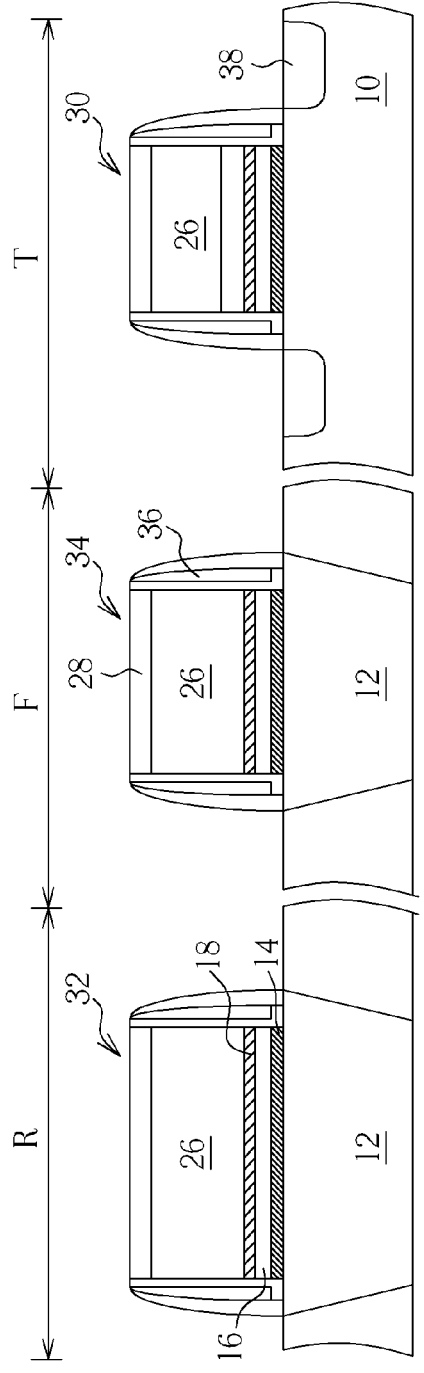
Figure 4:
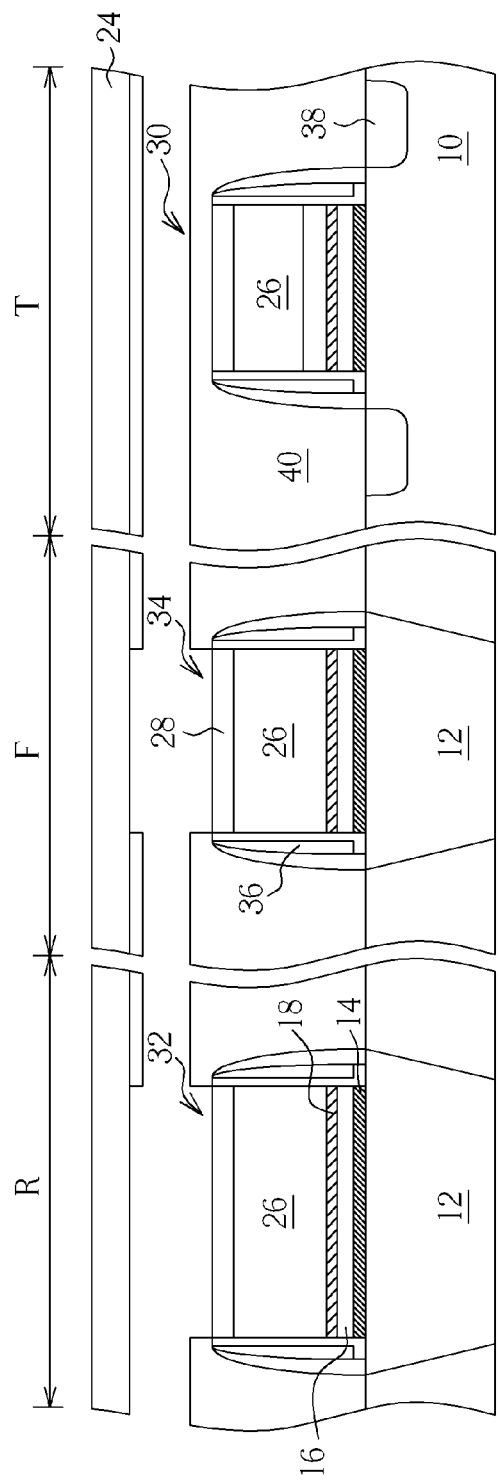
Figure 5:
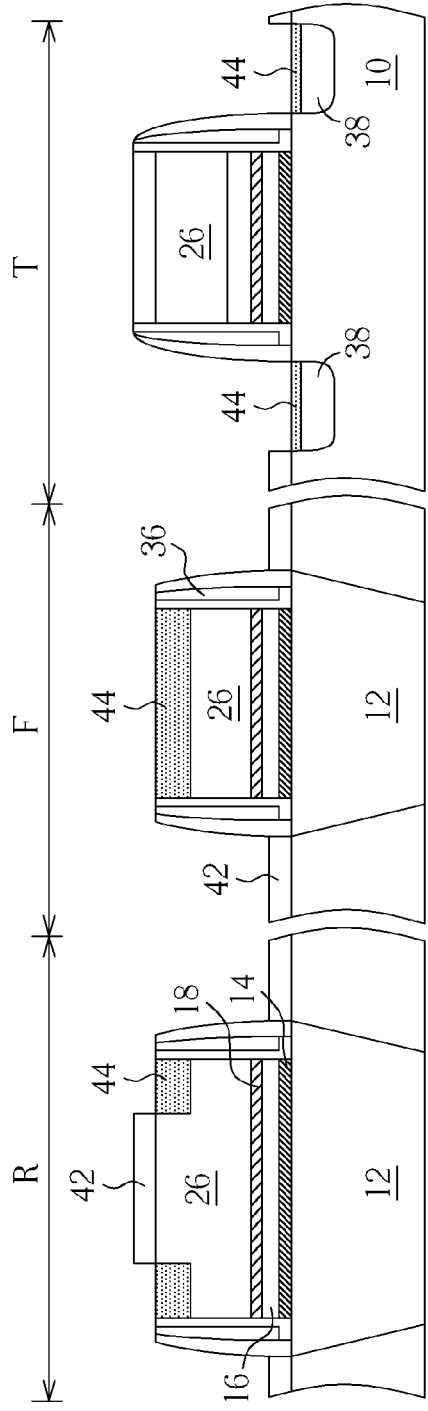

As shown in FIG. 3, the photoresist layer 22 is removed. Then, a polysilicon layer 26 and a hard mask 28 are formed to cover the transistor region T, the resistor region R and the efuse region F. Later, a patterned photoresist layer (not shown) and an etching process are used to pattern the hard mask 28, the polysilicon layer 26, the work function layer 20, the cap layer 18, the high-k material layer 16 and the dielectric layer 14 to form a gate 30, a resistor 32, an efuse 34 in the transistor region T, the resistor region R and the efuse region F, respectively. Later, a spacer 36 is formed on the sidewall of the gate 30, the resistor 32, and the efuse 34 respectively. The spacer 36 can be a single structure or a multiple structure. In this embodiment, the spacer 36 is shown as a multiple structure. After that, a source/drain doping region 38 is formed in or on the substrate 10 adjacent to the gate 30. More particularly, the source/drain doping region 38 can be underneath the main surface of the substrate 10 or protrudent above the main surface of the substrate 10. The source/drain doping region 38 may include SiGe or SiC. As shown in FIG. 4, a photoresist layer 40 is formed to cover the transistor region T, the resistor region R and the efuse region F. The photoresist layer 40 can be a positive type photoresist. Then, the photoresist layer 40 is patterned by the photo mask 24 and the hard mask 28 within the resistor region R and the efuse region F is exposed. It is noteworthy that the photo mask 24 used for patterning the photoresist layer 40 is also used for patterning the photoresist layer 22 in the previous step. Next, the hard mask 28 within the resistor region R and the efuse region F is removed, and the polysilicon layer 26 of the resistor 32 and of the efuse 34 is exposed. Later, as shown in FIG. 5, a patterned silicide block layer 42 is formed to cover a part of the resistor region R and a part of the efuse region F and expose the two ends of the polysilicon layer 26 in the resistor 32, the top surface of the polysilicon layer 26 in the efuse 34, and the source/drain doping region 38. Later, a salicide process is performed to form a silicide layer 44 in the source/drain doping region 38, the two ends of the polysilicon layer 26 in the resistor 32 and the top surface of the polysilicon layer 26 in the efuse 34.

Figure 6:
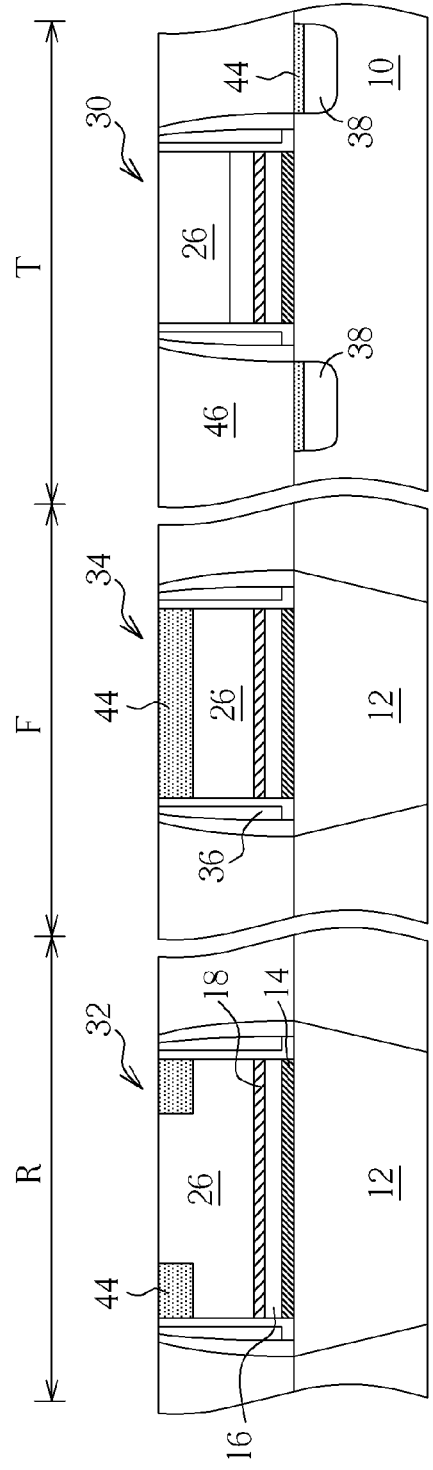

As shown in FIG. 6, after the patterned silicide block layer 42 is removed, a dielectric layer 46 is formed to cover the transistor region T, the resistor region R and the efuse region F. Then, the dielectric layer 46 is planarized to expose the polysilicon layer 26 of the gate 30, the polysilicon layer 26 and the silicide layer 44 of the resistor 30 and the silicide layer 44 of the efuse 34. The method of planarizing the dielectric layer 46 could be a chemical mechanical polishing process. When the dielectric layer 46 is planarized, the hard mask 28 in the gate 30 is also removed.

Figure 7:
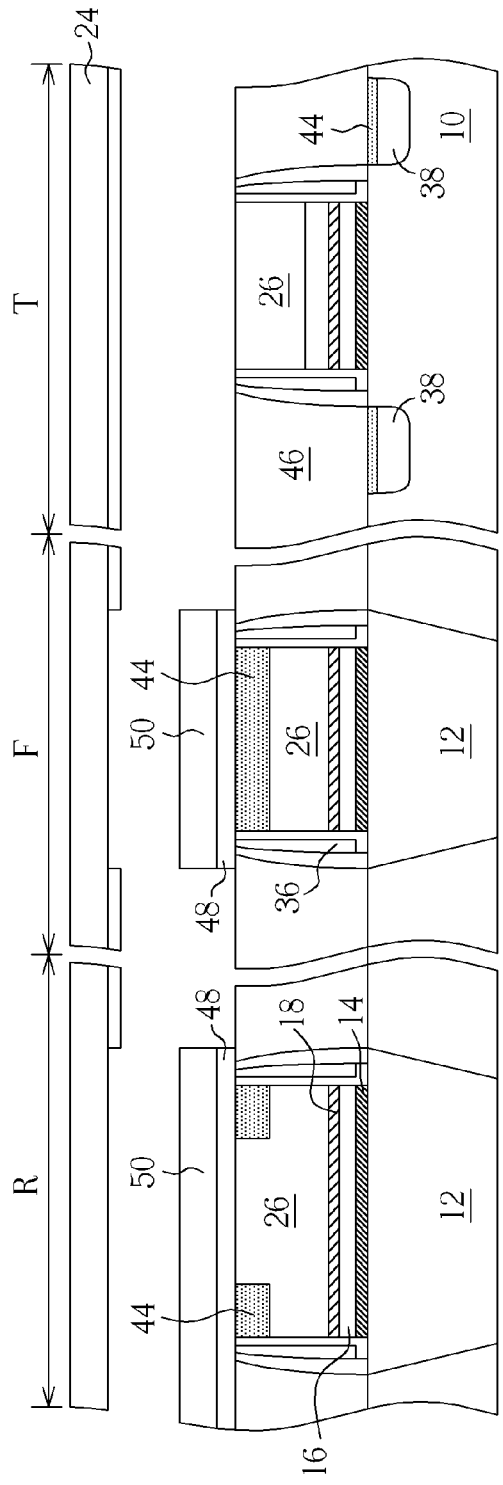

As shown in FIG. 7, a hard mask 48 and a photoresist layer 50 are formed in the transistor region T, the resistor region R and the efuse region F. Next, the hard mask 48 and the photoresist layer 50 are patterned by using the photo mask 24 in the lithographic process, and the transistor region T is exposed through the patterned hard mask 48 and the photoresist layer 50. The hard mask 48 can be a single structure or a multiple structure, and the hard mask 48 can be made of metal or non-metal. For example, the hard mask 48 can be a titanium nitride layer, a silicon nitride layer or a multiple structure having a silicon oxide layer as a top and a titanium nitride as a bottom. It is noteworthy that the photo mask 24 used in patterning hard mask 48 and the photoresist layer 50 are also used in the step illustrated in FIG. 2 and FIG. 4. However, the exposed region in FIG. 7 and that in the FIG. 2 and FIG. 4 are complementary. That is, in FIG. 7 the transistor region T is exposed and the resistor region R and the efuse region F are covered, but in FIG. 2 and FIG. 4 the transistor region T is covered, and the resistor region R and the efuse region F are exposed. Therefore, the photoresist layer 50 should have different characteristics from that of the photoresist layers 22, 40. For instance, if the photoresist layers 22, 40 are positive type photoresist, the photoresist layer 50 should be negative type photoresist.

Figure 8:
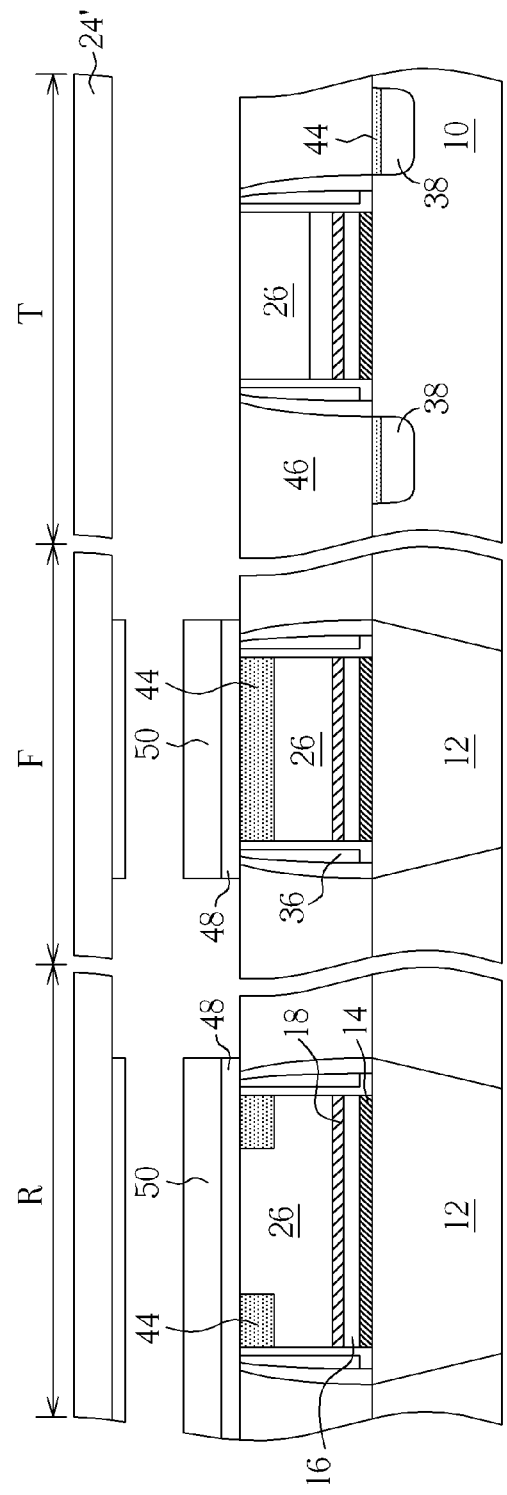

In addition, the step in FIG. 7 can be replaced by the step in FIG. 8. As shown in FIG. 8, the pattern on the photo mask 24' is complementary to the pattern on the photo mask 24. That is, a region on the photo mask 24' is light penetrable, but the corresponding region on the photo mask 24 is light shielded. By using the photo mask 24', the photoresist layer 50 should have the same characteristics as that of the photoresist layers 22, 40. For example, the photoresist layers 22, 40, 50 are all positive type photoresists.

Figure 9:
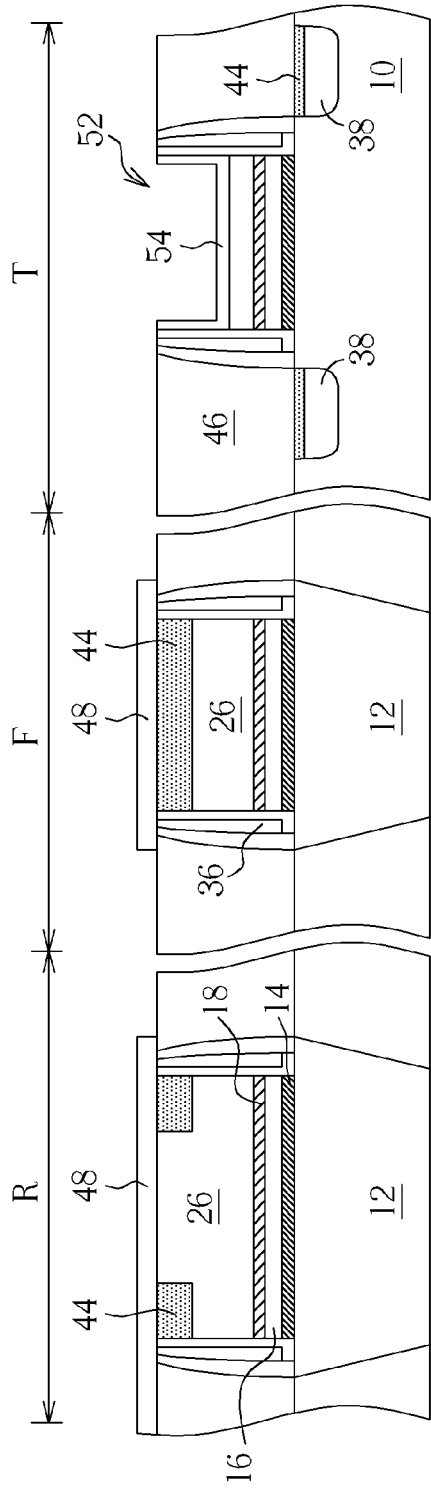
Figure 10:
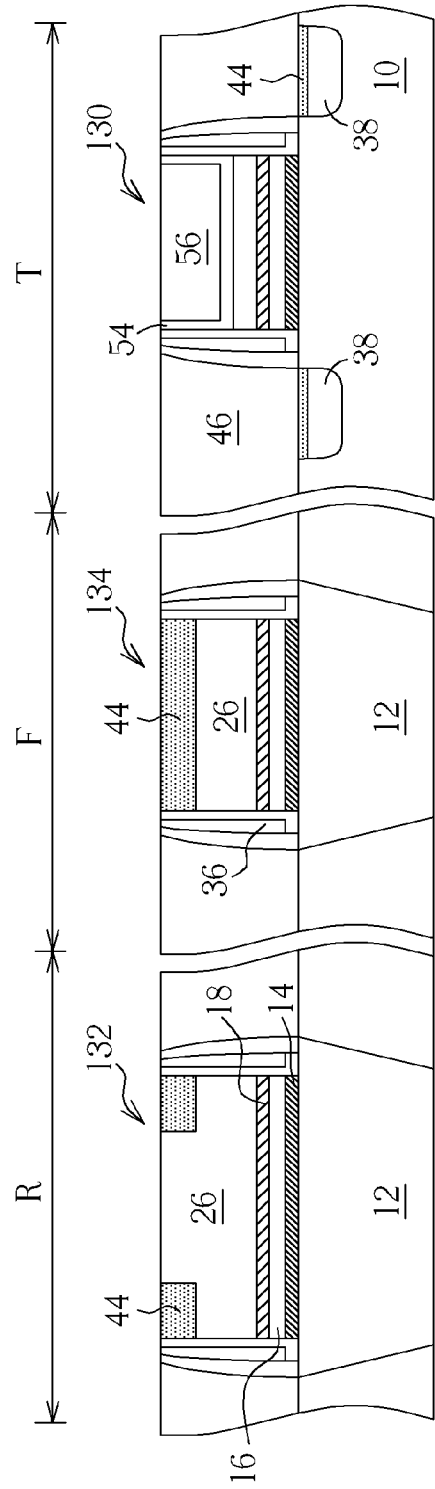

As shown in FIG. 9, after the photoresist layer 50 is removed, the polysilicon layer 26 within the transistor region T is removed to form a recess 52. Later, a work function layer 54 is formed to conformally cover the work function layer 20 and the spacer 36. As shown in FIG. 10, a metal layer 56 is formed to cover the transistor region T, the resistor region R and the efuse region F and fills up the recess 52. Then, the metal layer 56 is planarized until the dielectric layer 46 is exposed. Now, the transistor structure 130, the resistor structure 132 and the efuse structure 134 of the present invention are completed.

If the hard mask 48 includes metal such as titanium nitride, or a multiple structure of titanium nitride and titanium oxide, the hard mask 48 is removed when the metal layer 56 is planarized. If the hard mask 48 is silicon nitride, some hard mask 48 will remain on the resistor region R and the efuse region F after the metal layer 56 is planarized. The remaining hard mask 48 can be removed by another process or just keep it on the resistor region R and the efuse region F for protecting the silicide 44 on the resistor 32 and the efuse 34. The remaining hard mask 48 can be etched during the contact hole formation afterwards.

It is noteworthy that the hard mask 48 rather than a photoresist layer is used as a mask for etching the polysilicon layer 26 in the gate 30. If only the photoresist layer is used as a mask, the photoresist layer contacts the silicide 44 on the resistor 32 and the efuse 34 directly. When the photoresist layer is removed by a chemical solution, the chemical solution damages the surface of the silicide 44. On the contrary, using the hard mask 48 as a mask can prevent the damage.

After the transistor structure 130, the resistor structure 132 and the efuse structure 134 of the present invention are completed, a metal interconnection can be formed. For, example, another dielectric layer can be formed on transistor region T, the resistor region R and the efuse region F. Then, a plurality of contact plugs can be formed in the aforesaid dielectric layer to electrically connect to the source/drain doping region, the metal gates, the silicide at two sides of the resistor and the silicide at the efuse, respectively. A plurality of wires can be formed to connect the contact plugs.

The feature of the present invention is that the same photo mask can be used repeatedly in several lithographic processes, therefore, the cost of making photo mask is saved.

Moreover, the polysilicon layer within the transistor region is removed by taking a hard mask as a mask so the silicide will not be damaged.

Those skilled in the art will readily observe that numerous modifications and alterations of the device and method may be made while retaining the teachings of the invention.

What is claimed is:

1. A method of fabricating an efuse structure, a resistor structure and a transistor structure comprising:
    providing a substrate comprising a transistor region, a resistor region, and an efuse region;
    forming a work function layer, a polysilicon layer and a first hard mask covering the transistor region, the resistor region, and the efuse region;
    removing the work function layer on the resistor region and the efuse region by utilizing a first photo mask;
    patterning the work function layer, the polysilicon layer and the first hard mask to form a gate, a resistor, an efuse in the transistor region, the resistor region, and the efuse region, respectively;
    removing the first hard mask in the resistor region and the efuse region respectively by utilizing the first photo mask;
    forming a planarized dielectric layer on the substrate, and exposing the polysilicon layer in the gate, the resistor and the efuse;
    removing the polysilicon layer in the gate by utilizing a second hard mask as a mask to form a recess; and
    forming a metal layer to fill up the recess; and
    removing the second hard mask.

2. The method of fabricating an efuse structure, a resistor structure and a transistor structure of claim 1, wherein the step of forming the second hard mask comprises:
    before forming the recess, forming a photoresist layer and a third hard mask covering the transistor region, the resistor region, and the efuse region;
    patterning the photoresist layer by utilizing the first photo mask to expose the transistor region;
    patterning the third hard mask to form the second hard mask by taking the photoresist layer as a mask; and
    removing the photoresist layer.

3. The method of fabricating an efuse structure, a resistor structure and a transistor structure of claim 1, wherein the second hard mask comprises silicon nitride.

4. The method of fabricating an efuse structure, a resistor structure and a transistor structure of claim 1, wherein the second hard mask comprises metal complex.

5. The method of fabricating an efuse structure, a resistor structure and a transistor structure of claim 4, wherein the second hard mask comprises titanium nitride.

6. The method of fabricating an efuse structure, a resistor structure and a transistor structure of claim 5, further comprising:
    when forming the metal layer to fill up the recess, the metal layer covering the transistor region, the resistor region, and the efuse region simultaneously; and
    planarizing the metal layer and the second hard mask to align the metal layer with the dielectric layer.

7. The method of fabricating an efuse structure, a resistor structure and a transistor structure of claim 1, wherein the method of forming the second hard mask comprises:
    before forming the recess, forming a photoresist layer and a third hard mask covering the transistor region, the resistor region, and the efuse region;
    patterning the photoresist layer by utilizing a second photo mask to expose the transistor region, wherein the pattern in the first photo mask and the pattern in the second photomask are complementary;
    patterning the third hard mask to form the second hard mask by taking the photoresist layer as a mask; and
    removing the photoresist layer.

8. The method of fabricating an efuse structure, a resistor structure and a transistor structure of claim 1, further comprising:
    after forming the gate, the resistor, and the efuse, forming a spacer on the gate, the resistor, the efuse respectively; and
    forming a source/drain doping region in the substrate adjacent to the gate.

9. The method of fabricating an efuse structure, a resistor structure and a transistor structure of claim 1, further comprising:
    before planarizing the dielectric layer, performing a salicide process to form a silicide on the source/drain doping region, the resistor, the efuse, respectively.

10. The method of fabricating an efuse structure, a resistor structure and a transistor structure of claim 9, further comprising:
    before performing the salicide process, forming a salicide block layer on the substrate, and on the middle of the polysilicon layer of the resistor.

11. The method of fabricating an efuse structure, a resistor structure and a transistor structure of claim 10, wherein the silicide is positioned on the two ends of the polysilicon layer of the resistor and the top surface of the polysilicon layer of the efuse.

12. A method of fabricating an efuse structure, a resistor structure and a transistor structure comprising:
    providing a substrate comprising a transistor region, a resistor region, and an efuse region;
    forming a work function layer, a polysilicon layer and a first hard mask covering the transistor region, the resistor region, and the efuse region;
    covering the transistor region by a patterned first photoresist layer formed by a first photo mask;
    removing the work function layer on the resistor region and the efuse region by taking the patterned first photoresist layer as a mask;
    forming a gate, a resistor, and an efuse in the transistor region, the resistor region, and the efuse region, respectively;
    forming a planarized dielectric layer on the substrate, and exposing the polysilicon layer in the gate, the resistor and the efuse;
    forming a patterned second photoresist layer by the first photomask to cover the transistor region and the efuse region, wherein the patterned first photoresist layer and the patterned second photoresist layer are different types;
    removing the polysilicon layer in the gate to form a recess; and
    forming a metal layer that fills up the recess.

13. The method of fabricating an efuse structure, a resistor structure and a transistor structure of claim 12, further comprising:
    after forming the gate, the resistor, and the efuse, forming a spacer on the gate, the resistor, the efuse respectively; and
    forming a source/drain doping region in the substrate adjacent to the gate.

14. The method of fabricating an efuse structure, a resistor structure and a transistor structure of claim 13, further comprising:

before planarizing the dielectric layer, removing the first hard mask in the resistor region and the efuse region; and forming a silicide on the source/drain doping region, the resistor, the efuse, respectively.

15. The method of fabricating an efuse structure, a resistor structure and a transistor structure of claim 14, wherein the method of removing the first hard mask in the resistor region and the efuse region comprises:

covering the transistor region by a patterned third photoresist layer formed by the first photo mask, wherein the patterned first photoresist layer and the patterned third photoresist layer are the same type;

taking the patterned third photoresist layer as a mask to remove the first hard mask in the resistor region and in the efuse region.

16. The method of fabricating an efuse structure, a resistor structure and a transistor structure of claim 12, wherein the there is a patterned second hard mask under the patterned second photoresist layer, and the pattern on the patterned second hard mask and the pattern on the patterned second photoresist layer are the same.

17. The method of fabricating an efuse structure, a resistor structure and a transistor structure of claim 16, wherein the method of forming the recess comprises:

removing the patterned second photoresist layer;

taking the patterned second hard mask as a mask to form the recess; and removing the patterned second hard mask.

\* \* \* \* \*